United States Patent
Han et al.

(10) Patent No.: US 11,101,194 B2
(45) Date of Patent: Aug. 24, 2021

(54) HEAT SINKS AND METHODS FOR FABRICATING A HEAT SINK

(71) Applicant: Agency for Science, Technology and Research, Singapore (SG)

(72) Inventors: Yong Han, Singapore (SG); Boon Long Lau, Singapore (SG); Daniel Minwo Rhee, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 176 days.

(21) Appl. No.: 16/470,961

(22) PCT Filed: Dec. 19, 2017

(86) PCT No.: PCT/SG2017/050626
§ 371 (c)(1),
(2) Date: Jun. 18, 2019

(87) PCT Pub. No.: WO2018/117962
PCT Pub. Date: Jun. 28, 2018

(65) Prior Publication Data
US 2020/0029463 A1    Jan. 23, 2020

(30) Foreign Application Priority Data

Dec. 19, 2016 (SG) ............................ 10201610609Q

(51) Int. Cl.
*H01L 23/473* (2006.01)
*F28F 13/06* (2006.01)
*H05K 7/20* (2006.01)

(52) U.S. Cl.
CPC .......... *H01L 23/4735* (2013.01); *F28F 13/06* (2013.01); *H05K 7/20263* (2013.01);
(Continued)

(58) Field of Classification Search
CPC . H01L 23/4735; H05K 7/20263; F28F 13/06; F28F 2215/00
(Continued)

(56) References Cited

U.S. PATENT DOCUMENTS 5,063,476 A * 11/1991 Hamadah .............. H01L 23/467
361/697
5,270,572 A * 12/1993 Nakajima ........... H01L 23/4735
165/104.33
(Continued)

FOREIGN PATENT DOCUMENTS

| CN | 104159436 A | 11/2014 | |
| FR | 2833803 A1 * | 6/2003 | ......... H01L 23/4735 |
| JP | 2012248576 A | 12/2012 | |

OTHER PUBLICATIONS

Mizuno, et al., "Si Microchannel Cooler Integrated with High Power Amplifiers for Base Station of Mobile Communication Systems," ECTC, 2011, pp. 1541-1546.
(Continued)

*Primary Examiner* — Devon Russell
(74) *Attorney, Agent, or Firm* — Winstead PC

(57) ABSTRACT

According to various embodiments, there is provided a heat sink including: a heat conducting surface; a plurality of nozzle arrays arranged such that output ends of nozzles of the plurality of nozzle arrays face the heat conducting surface; and a plurality of fins configured to at least partially surround a respective portion of the heat conducting surface facing a respective nozzle array of the plurality of nozzle arrays.

14 Claims, 11 Drawing Sheets

(52) U.S. Cl.
CPC ....... *F28F 2210/10* (2013.01); *F28F 2215/00* (2013.01); *F28F 2255/04* (2013.01)

(58) Field of Classification Search
USPC .................................................. 165/104.19
See application file for complete search history.

(56) References Cited

U.S. PATENT DOCUMENTS

| | | | | |
|---|---|---|---|---|
| 5,349,831 | A | * | 9/1994 | Daikoku ............... H01L 23/427 165/80.4 |
| 5,453,911 | A | | 9/1995 | Wolgemuth et al. |
| 6,519,151 | B2 | * | 2/2003 | Chu .................... H01L 23/4735 165/80.4 |
| 6,571,569 | B1 | * | 6/2003 | Rini .......................... F25B 1/00 257/715 |
| 7,331,377 | B1 | * | 2/2008 | Toy ....................... F28F 13/185 165/80.4 |
| 7,836,706 | B2 | * | 11/2010 | Tilton ....................... F28D 5/00 62/64 |
| 9,903,664 | B2 | * | 2/2018 | Joshi .................. H01L 23/4735 |
| 2002/0062945 | A1 | * | 5/2002 | Hocker .................. F01D 5/189 165/53 |
| 2005/0072177 | A1 | * | 4/2005 | Hale .......................... F28F 3/12 62/310 |
| 2005/0210906 | A1 | | 9/2005 | Laufer et al. |
| 2006/0162365 | A1 | * | 7/2006 | Hoang ................ H01L 23/4735 62/259.2 |
| 2007/0091565 | A1 | | 4/2007 | Malone et al. |
| 2009/0145581 | A1 | | 6/2009 | Hoffman et al. |
| 2014/0204532 | A1 | | 7/2014 | Mehring |
| 2014/0284029 | A1 | * | 9/2014 | Yoshida .................. F28F 13/06 165/104.31 |

OTHER PUBLICATIONS

Waye et al., "Advanced Liquid Cooling for a Traction Drive Inverter Using Jet Impingement and Microfinned Enhanced Surfaces," ITHERM, USA, 2014, pp. 1064-1073.

Colgan et al., "A Practical Implementation of Silicon Microchannel Coolers for High Power Chips," IEEE Trans. on CPT, vol. 30, No. 2, Jun. 2007, pp. 218-225.

Fabbri et al., "Optimized Heat Transfer for High Power Electronic Cooling Using Arrays of Microjets," Journal of Heat Transfer, vol. 127, No. 7, Jul. 2005, pp. 760-769.

Wang et al., "Micromachined Jets for Liquid Impingement Cooling of VLSI Chips," Journal of Microelectromechanical Systems, vol. 13, No. 5, Oct. 2004, pp. 833-842.

Brunschwiler et al., "Direct Liquid Jet-Impingement Cooling with Micron-Sized Nozzle Array and Distributed Return Architecture," 10th ICTTPETES, San Diego, CA, United States, 2006, pp. 196-203.

Michna et al., "The Effect of Area Ratio on Microjet Array Heat Transfer," International Journal of Heat and Mass Transfer, vol. 54, 2011, pp. 1782-1790.

Written Opinion of the International Searching Authority for International Application No. PCT/SG2017/050626 dated Mar. 23, 2018, pp. 1-5.

International Search Report for International Application No. PCT/SG2017/050626 dated Mar. 23, 2018, pp. 1-3.

International Preliminary Report on Patentability for International Application No. PCT/SG2017/050626 dated Nov. 9, 2018, pp. 1-18.

* cited by examiner

Normal heat sink

Proposed heat sink (extension C)

HEAT SINKS AND METHODS FOR FABRICATING A HEAT SINK

CROSS-REFERENCE TO RELATED APPLICATIONS

This application claims the benefit of Singapore Patent Application number 10201610609Q filed 19 Dec. 2016, the entire contents of which are incorporated herein by reference for all purposes.

TECHNICAL FIELD

Various embodiments relate to heat sinks and methods for fabricating a heat sink.

BACKGROUND

Electrical and electronic devices are becoming shrinking in feature sizes while incorporating more functions and being capable of faster circuit speeds. This leads to the devices being much more densely packed, and as a result, the heat flux generated by these devices significantly increases. Temperature distribution uniformity is a big challenge for the devices with high heat flux. To ensure that these devices can perform efficiently and reliably, an effective thermal management solution is required. Existing thermal management solutions include air cooling, as well as liquid cooling. However, these existing thermal management solutions struggle to keep up with the increasing heat generation of high performance chips and high power devices.

SUMMARY

According to various embodiments, there may be provided a heat sink including: a heat conducting surface; a plurality of nozzle arrays arranged such that output ends of nozzles of the plurality of nozzle arrays face the heat conducting surface; and a plurality of fins configured to at least partially surround a respective portion of the heat conducting surface facing a respective nozzle array of the plurality of nozzle arrays.

According to various embodiments, there may be provided a heat sink including: a heat conducting surface; and a nozzle array arranged such that output ends of nozzles of the nozzle array face the heat conducting surface, the nozzle array including a first nozzle and a second nozzle; wherein a distance between the output end of the first nozzle and the heat conducting surface is shorter than a distance between the output end of the second nozzle and the heat conducting surface.

According to various embodiments, there may be provided a method for fabricating a heat sink, the method including: arranging a plurality of nozzle arrays such that output ends of nozzles of the plurality of nozzle arrays face a heat conducting surface; and at least partially surrounding a respective portion of the heat conducting surface facing a respective nozzle array of the plurality of nozzle arrays with a plurality of fins.

According to various embodiments, there may be provided a method for fabricating a heat sink, the method including: arranging a nozzle array such that output ends of nozzles of the nozzle array face a heat conducting surface, the nozzle array including a first nozzle and a second nozzle, wherein a distance between the output end of the first nozzle and the heat conducting surface is shorter than a distance between the output end of the second nozzle and the heat conducting surface.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1:
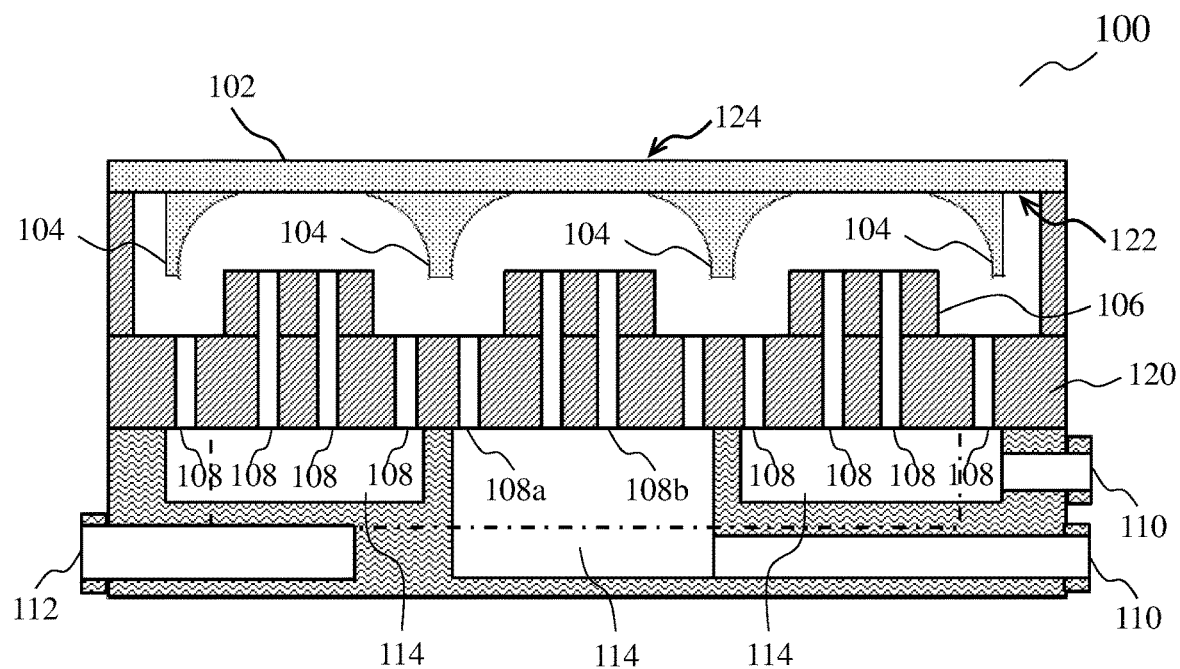
FIG. 1 shows a cross-sectional view of a heat sink according to various embodiments.

Embodiments described below in context of the devices are analogously valid for the respective methods, and vice versa. Furthermore, it will be understood that the embodiments described below may be combined, for example, a part of one embodiment may be combined with a part of another embodiment.

It will be understood that any property described herein for a specific device may also hold for any device described herein. It will be understood that any property described herein for a specific method may also hold for any method described herein. Furthermore, it will be understood that for any device or method described herein, not necessarily all the components or steps described must be enclosed in the device or method, but only some (but not all) components or steps may be enclosed.

In this context, the heat sink as described in this description may include a memory which is for example used in the processing carried out in the heat sink. A memory used in the embodiments may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory)).

In an embodiment, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with an alternative embodiment.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

In the specification the term "comprising" shall be understood to have a broad meaning similar to the term "including" and will be understood to imply the inclusion of a stated integer or step or group of integers or steps but not the exclusion of any other integer or step or group of integers or steps. This definition also applies to variations on the term "comprising" such as "comprise" and "comprises".

The term "coupled" (or "connected") herein may be understood as electrically coupled or as mechanically coupled, for example attached or fixed, or just in contact without any fixation, and it will be understood that both direct coupling or indirect coupling (in other words: coupling without direct contact) may be provided.

The reference to any conventional devices in this specification is not, and should not be taken as an acknowledgement or any form of suggestion that the referenced conventional devices form part of the common general knowledge in Australia (or any other country).

In the context of various embodiments, the phrase "cooling liquid" may be but is not limited to being interchangeably referred to as a "cooling fluid" or a "coolant". The cooling liquid may have a high thermal capacity.

In order that the invention may be readily understood and put into practical effect, various embodiments will now be described by way of examples and not limitations, and with reference to the figures.

According to various embodiments, a heat sink may include micro-scale jet nozzles configured to impinge cooling fluid onto a surface. The heat sink may be used for cooling electronic devices. The heat sink may achieve a high heat transfer rate and uniform cooling of the electronic device. The heat sink may also require lower pumping power. The heat sink may achieve a high Nusselt number. The heat sink may be capable of minimizing negative cross-flow effect, by at least one of its unique arrangement of the jet nozzles (herein also referred simply as "nozzles") or the use of fins that at least partially surround the nozzles. The unique arrangement of the nozzles may include nozzle arrays of different lengths, integrated in raised structures. The nozzles may be provided in raised nozzle arrays. The fins may surround the raised structures, or raised nozzle arrays. The fins may be fixed in position or shape. Alternatively, the fins may also be thermally-activatable, i.e. changes in shape upon an increase in temperature. The nozzles of the heat sink may be arranged in groups. Each group of nozzles may be referred to as a nozzle array. Each nozzle array may be separately controllable. For example, one nozzle array may be activated to remove heat from a localized spot while the other nozzle arrays may remain inactive. With the raised nozzle structure and the fins, the heat sink may eliminate negative cross flow and achieve fully developed impingement for each nozzle. The uniform flow distribution and separately controllable nozzle arrays may make the new heat sink an excellent candidate for extreme high heat flux cooling. The heat sink may achieve more than 50% heat transfer coefficient increase, more than 45% thermal resistance reduction, improvement in cooling uniformity by more than 60%, as compared to conventional heat sinks.

FIG. 1 shows a cross-sectional view of a heat sink 100 according to various embodiments. The heat sink 100 may include an impinging wall 102. The impinging wall 102 may be fabricated from a heat-conductive material. The impinging wall 102 may provide an inner heat conducting surface 122 and an outer heat conducting surface 124. The impinging wall 102 may be efficient at transferring heat energy between the inner heat conducting surface 122 and the outer heat conducting surface 124. The heat sink 100 may include a plurality of fins 10 formed under the impinging wall 102, coupled to the inner heat conducting surface 122. The fins 104 may serve to prevent cross-flow, and thus, may also be referred herein as "cross-flow preventing fins", or simply "preventing fins". The heat sink 100 may further include a nozzle wall 120. The nozzle wall 120 may include a plurality of nozzles 108 formed therein. The nozzles 108 may extend through the thickness of the nozzle wall 120. The heat sink 100 may further include a raised structure 106 arranged above the nozzle wall 120, and some of the nozzles 108 may further extend through the thickness of the raised structure 106. The raised structure 106 may provide a stepped-nozzle array formation, such that the plurality of nozzles 108 may include nozzles 108 of different lengths. For example, nozzle 108a that extends through the nozzle wall 120 may be shorter than nozzle 108b that extends through both the nozzle wall 120 and the raised structure 106. A first end (also referred herein as an output end) of each nozzle 108 may face the inner heat conducting surface 122, while an opposing second end (also referred herein as an input end) of the nozzle 108 may face a reservoir 114. The fins 104 may extend from the inner heat conducting surface 122, towards the output end of the nozzles 108. The fins 104 may be arranged between the impinging wall 102 and the nozzles 108. The reservoir 114 may serve to store cooling fluid or liquid. The heat sink 100 may include at least one reservoir 114. Each reservoir 114 may be in fluid communication with a different group of nozzles 108. Each reservoir 114 may receive fluid from an inlet 110. In operation, the nozzles 108 may draw cooling liquid from the reservoir 114, and may eject the cooling liquid onto the impinging wall 102. The nozzles 108 may eject the cooling liquid with large pressures such that the cooling liquid impinges the inner heat conducting surface 122 at high speeds. The fins 104 may help to direct the jets of cooling liquid ejected from a group of nozzles 108 to be impinged on a corresponding portion of the inner heat conducting surface 122. The corresponding portion of the inner heat conducting surface 122 may be at least substantially directly facing the group of nozzles 108. In other words, each portion of the inner heat conducting surface 122 may at least substantially directly face a respective nozzle array. This ensures efficiency of the cooling mechanism, as the cooling liquid is used to cool a section of the impinging wall 102 that is nearest to the nozzle opening. The cooling liquid that contacts the impinging wall 102 is thus, still at the coldest possible temperature so that the cooling liquid may absorb as much heat energy as possible, from the impinging wall 102. The cooling liquid that is ejected from the nozzles 108 may be collected through a drainage channel, and then removed from the heat sink through an outlet 112. The outlet 112 and the inlet(s) 110 may be arranged at a bottom of the heat sink, or at a side of the heat sink.

The fins 104 may be made of shape memory materials. Alternatively, or in combination, the fins 104 may have predefined, constant shapes. The fins 104 may enable passively adjustable jet flow distribution, for reducing the pumping power for low heating case and for improving the cooling capability for high heating case. When the impinging wall temperature reaches an activation point, the fins 104 may be activated into extending out of the impinging wall 102 towards the nozzles 108. As a result, the spent flow between adjacent nozzle groups may be constrained. The impinging jets may be protected from both top and bottom sides from the cross flow, so that each nozzle may fully impinge fluid on the corresponding portion of the impinging wall 102.

The heat sink 100 may include a plurality of nozzle groups, also referred herein as nozzle arrays. Each nozzle group may include at least one nozzle 108. The heat sink 100 may include a controller configured to separately control operations of each nozzle group. By controlling each nozzle group separately, the controller may selectively cool any section or zone of the impinging wall 102 that directly faces the nozzle group. In other words, each nozzle group of the heat sink 100 may be independently operated. This allows the heat sink 100 to effectively focus on cooling hot spots. Also, the heat sink 100 may consume less energy while achieving the same level of heat transfer as conventional heat sinks, as the heat sink 100 may selectively cool the hotter parts of the impinging wall 102. The heat sink 100 may cool a hot spot of the impinging wall 102 with a larger quantity of cooling liquid while using a lesser quantity of cooling liquid on a less hot section of the impinging wall 102.

Figure 2:
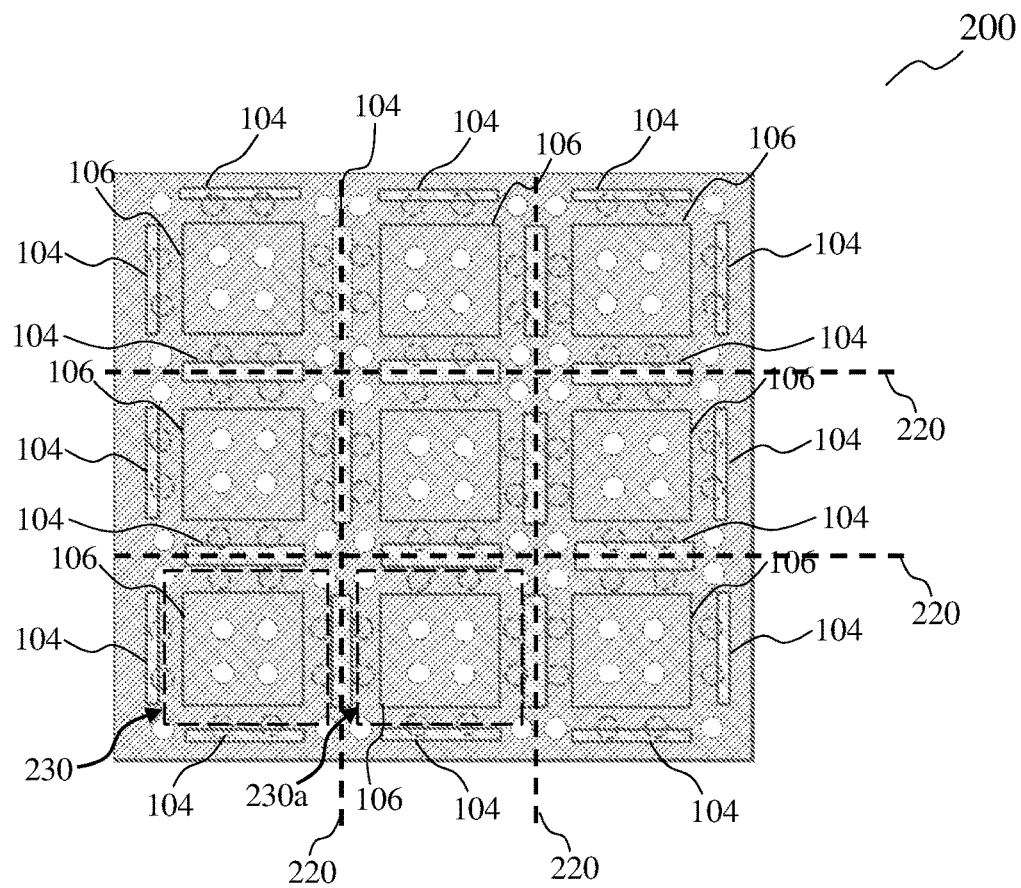
FIG. 2 shows a top view of the heat sink of FIG. 1.

FIG. 2 shows a top view 200 of the heat sink 100. The heat sink 100 may include a plurality of nozzle groups. The top view 200 shows each nozzle group as an approximately square section demarcated by the dashed lines 220. Each nozzle group may include a raised structure 106 and a plurality of nozzles 108. The nozzles 108 may extend through the raised structure 106, as well as extend through the nozzle wall 120 where there is no raised structure 106. Each nozzle group may be at least partially surrounded by fins 104. The fins 104 may lie adjacent to each side of the nozzle group. As an example, a first nozzle group 230 and a second nozzle group 230a are indicated in the top view 200 by dashed lines.

Figure 3:
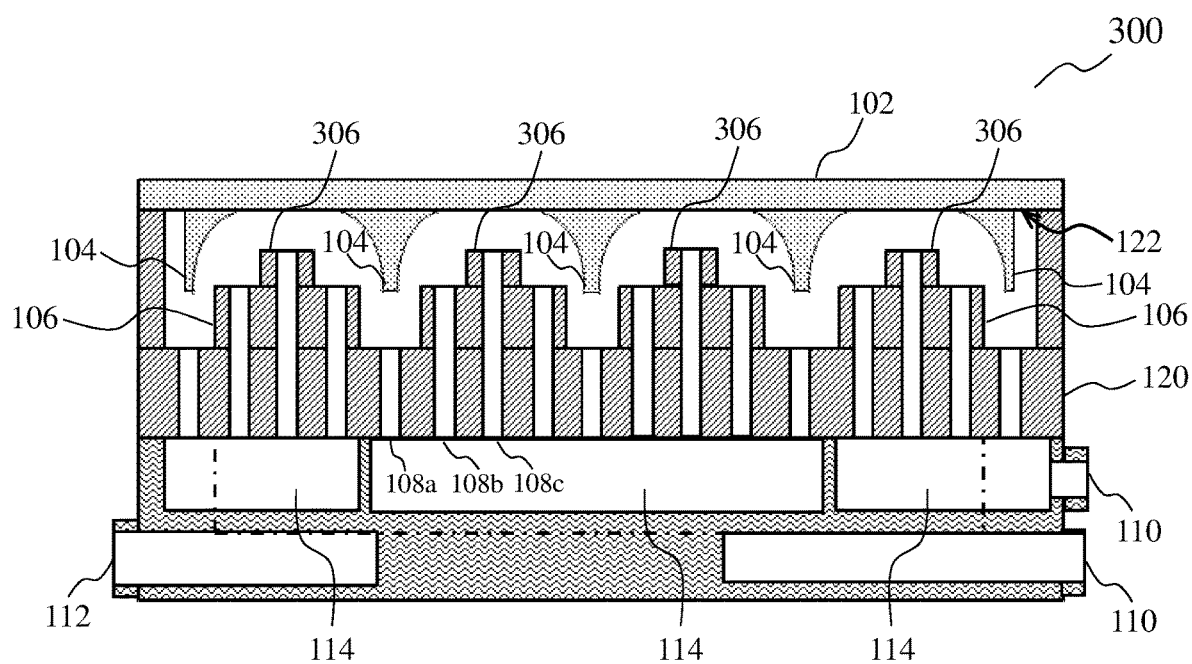
FIG. 3 shows a cross-sectional view of a heat sink according to various embodiments.

FIG. 3 shows a cross-sectional view of a heat sink 300 according to various embodiments. The heat sink 300 may be similar to the heat sink 100. In addition to the components of the heat sink 100, the heat sink 300 may further include a second raised structure 306. The second raised structure 306 may be overlaid on the raised structure 106 which in turn may be overlaid on the nozzle wall 120. As a result, the heat sink 300 may include a multi-step structure. The nozzle wall 120 may form a lowest step, followed by the raised structure 106 as an intermediate step, followed by the second raised structure 306 as the highest step. The second raised structure 306 may extend into a region at least partially surrounded by the fins 104. In other words, the distance between the second raised structure 306 and the inner heat conducting surface 122 may be shorter than a length of the fins 104. Each multi-step structure may house a nozzle array. Each nozzle array may include a plurality of nozzles 108. The plurality of nozzles 108 may include nozzle 108a, nozzle 108b and nozzle 108c. The nozzle 108a may be the shortest and may extend through the nozzle wall 120 only. The nozzle 108b may be longer than the nozzle 108a and may extend through both the nozzle wall 120 and the raised structure 106. The nozzle 108c may be longer than the nozzle 108b and may extend through all of the nozzle wall 120, the raised structure 106 and the second raised structure 306. Each of the nozzles 108a, 108b and 108c may have their output ends exposed and facing the inner heat conducting surface 122. The distance between the output end of the nozzle 108a from the inner heat conducting surface 122 may be larger than the distance between the nozzle 108b from the inner heat conducting surface 122. The distance between the output end of the nozzle 108b from the inner heat conducting surface 122 may be larger than the distance between the nozzle 108c from the inner heat conducting surface 122. It would be understood by the person skilled in the art that each nozzle array may include more steps by adding more raised structures. Each nozzle array may include nozzles of more than three different lengths. The distance between the output ends of some nozzles 108 from the inner heat conducting surface 122 may be shorter than the length of the fins 104. The length of the fins 104 may be defined as the distance that the fins 104 extend away from the inner heat conducting surface 122. As such, the output ends of some nozzles 108 may be at least partially surrounded by the fins 104. When these nozzles 108 eject cooling liquid through their output ends, the fins 104 may retain the ejected cooling liquid within an area surrounded by the fins 104. The fins 104 may prevent the ejected cooling liquid from coming into contact with portions of the inner heat conducting surface that are beyond the area surrounded by the fins 104. Each multi-step nozzle array may be at least partially surrounded by a respective plurality of fins 104. The respective plurality of fins 104 may at least partially surround a corresponding portion of the inner heat conducting surface that is at least substantially directly facing the multi-step nozzle array. By having multiple steps in each nozzle array, each nozzle array may be shaped to provide an even more targeted jet impingement on the respective corresponding portion of the inner heat conducting surface 122. In other words, by having the multiple steps, the jet of cooling liquid exiting from the nozzles 108 may be prevented from coming into contact with other portions of the inner heat conducting surface 122 that is not directly facing the nozzle.

Figure 4:
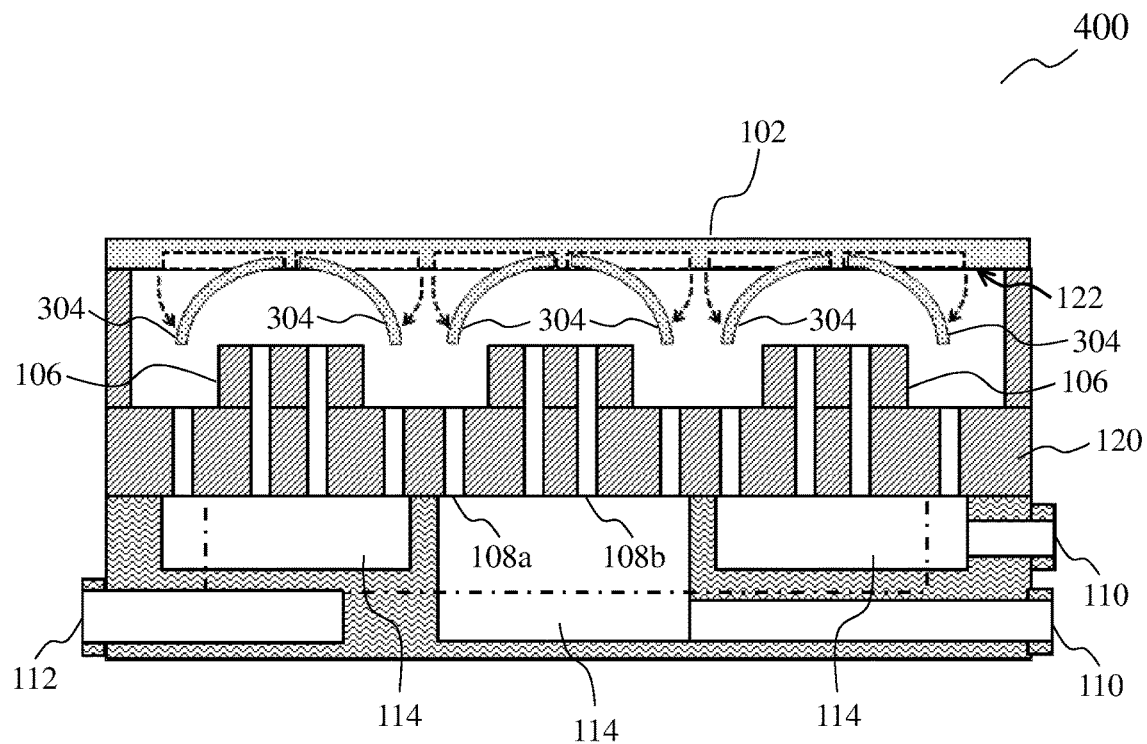
FIG. 4 shows a cross-sectional view of a heat sink according to various embodiments.

FIG. 4 shows a cross-sectional view of a heat sink 400 according to various embodiments. The heat sink 400 may be similar to the heat sink 100. In the heat sink 400, the fins 104 may be replaced by thermally-activated fins 304. The thermally-activated fins 304 may be activated to extend out towards the nozzle arrays, when the temperature of the impinging wall 102 exceeds an activation temperature. Below the activation temperature, the thermally-activated fins 304 may be at least substantially parallel, or may lie adjacent to the impinging wall 102. The thermally-activated fins 304 may be made of shape memory materials, and may achieve passive adjustable flow distribution inside the heat sink 400. When the fins 104 are deactivated below the activation temperature, flow resistance in the heat sink 400 may be decreased such that the heat sink 400 may require lower pumping energy. This may be advantageous when the electronic device and the impinging wall are at a low temperature, as the energy consumption of the heat sink 400 may be reduced.

Figure 5:
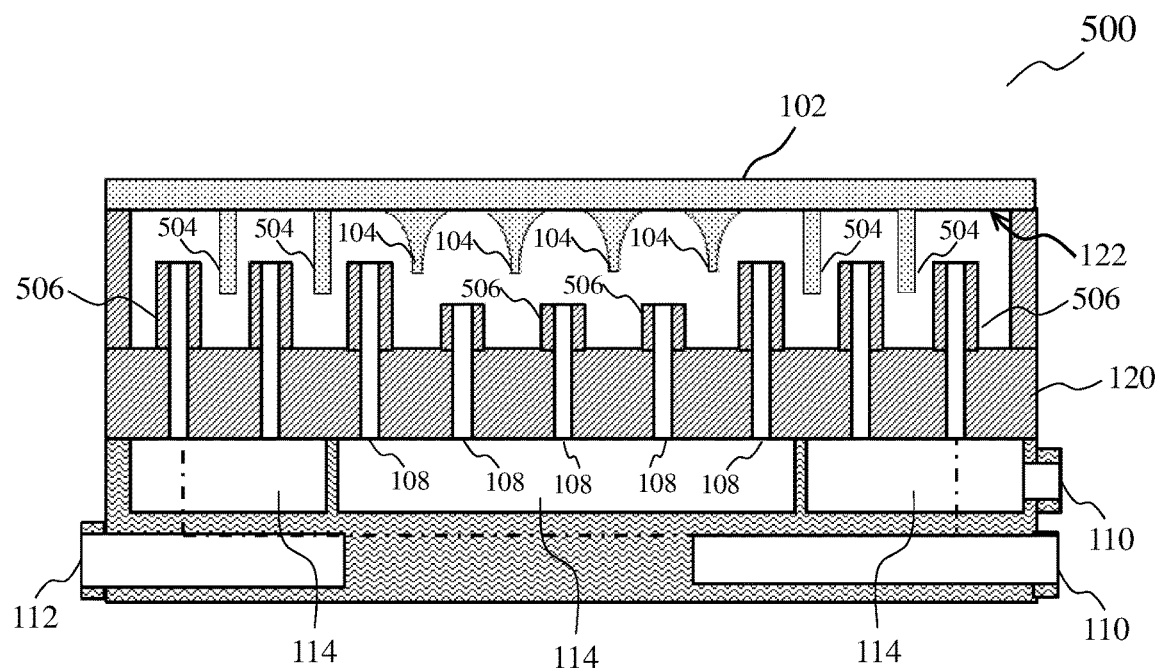
FIG. 5 shows a cross-sectional view of a heat sink according to various embodiments.

FIG. 5 shows a cross-sectional view of a heat sink 500 according to various embodiments. The heat sink 500 may be similar to the heat sink 100. Instead of a raised structure 106 of a uniform height, the heat sink 500 may include a plurality of third raised structures 506. The third raised structures 506 may be of different heights. The heat sink 500 may include nozzles 108 of different lengths. Each nozzle 108 may extend through the nozzle wall 120 and a respective third raised structure 506. As a result, the nozzles 108 in the heat sink 500 may be of different lengths. The heat sink 500 may include nozzle arrays that are of various different heights. Each nozzle array may include just one nozzle 108. Each portion of the inner heat conducting surface 122 at least substantially directly facing a respective nozzle 108 may be at least partially surrounded by fins 104. This may provide a high level of control over the exact position of the impinging wall 102 to be cooled. Alternatively, each nozzle array may include more than one nozzle 108, and each portion of the inner heat conducting surface 122 at least substantially directly facing a respective nozzle array may be at least partially surrounded by fins 104. The heat sink 500 may also include fins of different shapes and lengths. For example, the heat sink 500 may include rectangular fins 504, as well as fins 104 that may be arcuate in shape.

Figure 6:
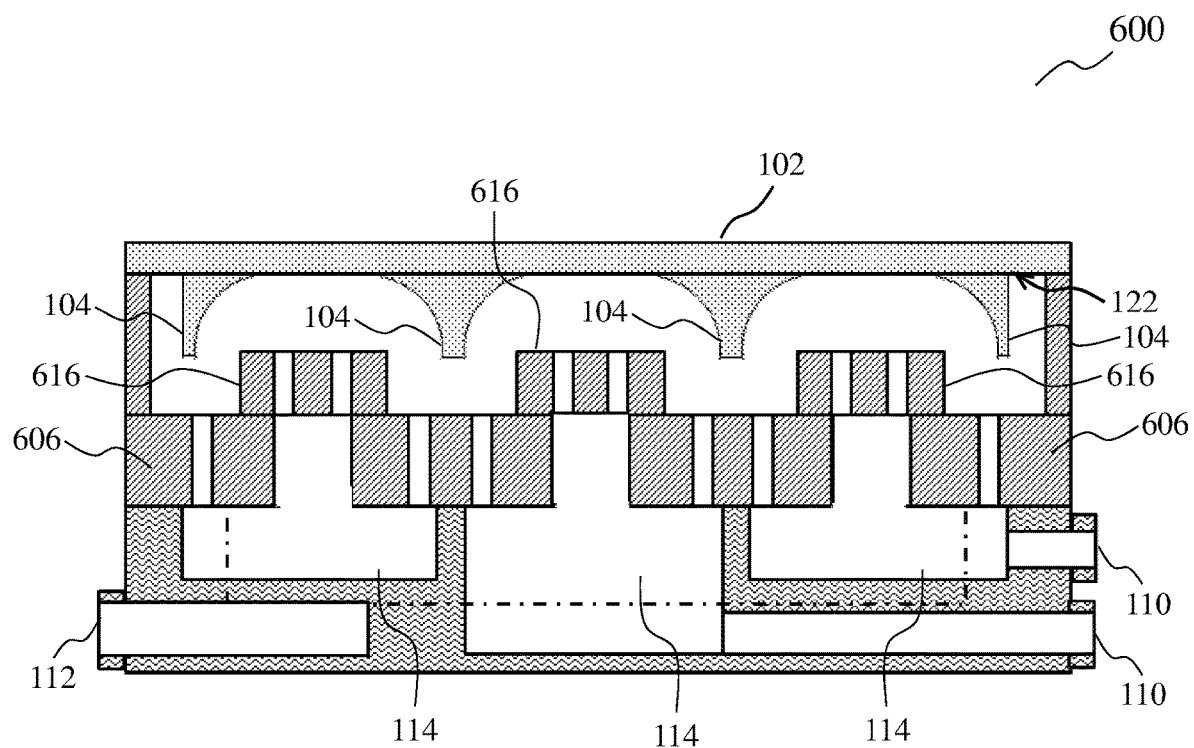
FIG. 6 shows a cross-sectional view of a heat sink according to various embodiments.

FIG. 6 shows a cross-sectional view of a heat sink 600 according to various embodiments. The heat sink 600 may be similar to the heat sink 100. Instead of a flat and level nozzle wall 120, the heat sink 600 may include a nozzle wall 606 that varies in thickness such that the plurality of nozzle arrays may be arranged at different heights to impinge at different target surfaces. The nozzle wall 606 may also be discontinuous at some points, in other words, may include gaps. The heat sink may include a further nozzle wall 616 that may partially overlap the nozzle wall 606, for example, to bridge the gaps. The further nozzle wall 616 may have a different thickness from the nozzle wall 606. The further nozzle wall 616 may be nearer to the inner heat conducting surface 122, than the nozzle wall 606. Some of the nozzles 108 may extend through the nozzle wall 606 only. Other nozzles 108 may extend through the further nozzle wall 616 only. Some nozzles 108 may extend through both the nozzle wall 606 and the further nozzle wall 616. The combination of the nozzle wall 606 and the further nozzle wall 616 may create a stepped nozzle array structure.

According to various embodiments, the impinging wall 102 may be planar. The inner heat conducting surface 122 may also be planar. Alternatively, the impinging wall 102 may not be planar. For example, the impinging wall 102 may be shaped to fit onto an electronic device, or a heat generating surface of the electronic device. The impinging wall 102 may be shaped to adhere to the electronic device with minimal gap between the heat sink and the electronic device, for effective heat transfer. The inner heat conducting surface 122 may also not be planar. For example, the inner heat conducting surface 122 may be curved, or may include steps, or may take on other shapes.

Simulations had been conducted to investigate the performances of the heat sink according to various embodiments, as compared to conventional heat sinks. In the following, the simulation results will be described.

Figure 7A:
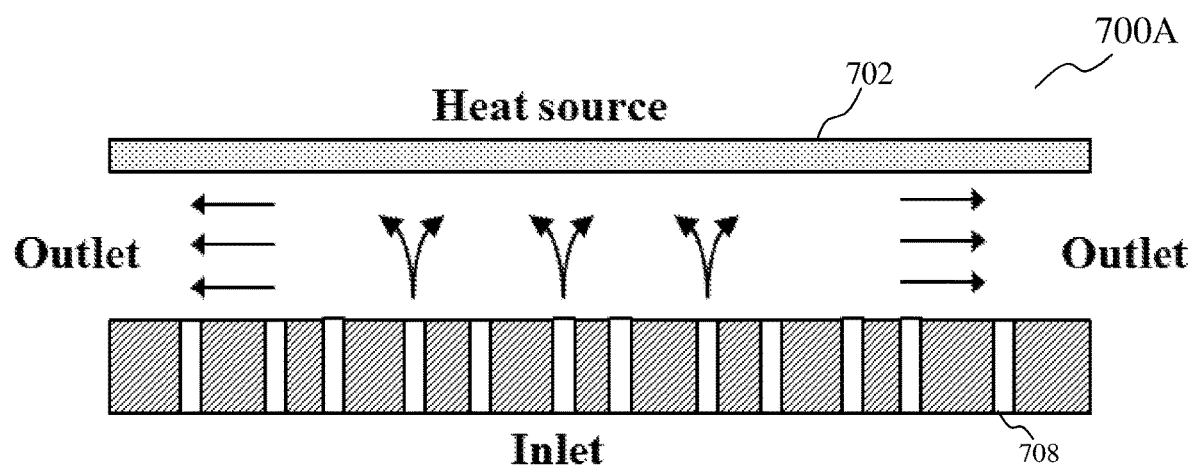
FIG. 7A shows a cross-sectional representative view of a conventional heat sink.

FIG. 7A shows a cross-sectional representative view 700A of a conventional heat sink. The conventional heat sink may include an impinging wall 702, and a plurality of nozzles 708. The nozzles 708 are uniform in length. Also, the conventional heat sink does not include any fins to prevent cross-flow.

Figure 7B:
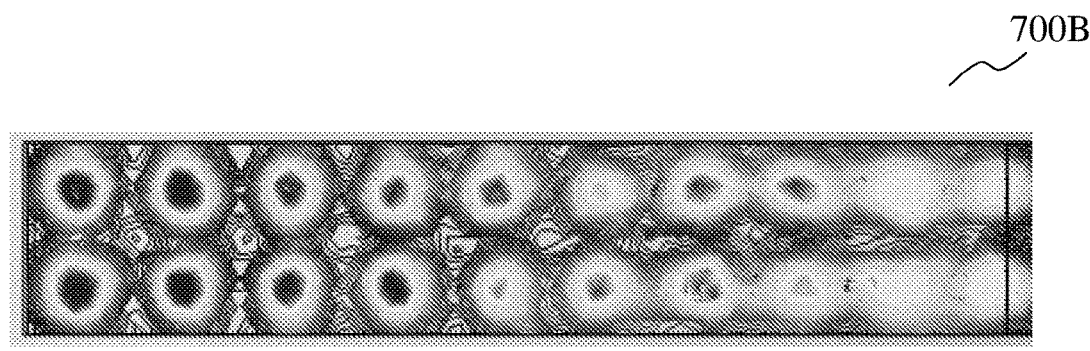
FIG. 7B shows a simulated heat map of the local heat transfer distribution of the conventional heat sink of FIG. 7A.

FIG. 7B shows a simulated heat map 700B of the local heat transfer distribution of the conventional heat sink of FIG. 7A. The heat map 700B shows that the local heat transfer coefficient is not uniform across the heat sink. In other words, the heat transfer in the heat sink is not efficient.

Figure 7C:
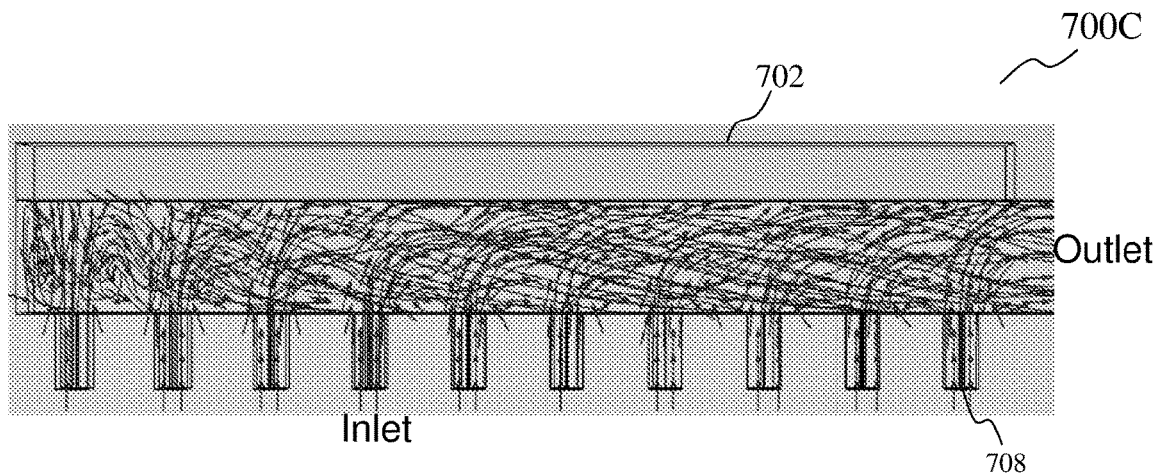
FIG. 7C shows a streamline and flow arrow distribution map of the conventional heat sink of FIG. 7A.

FIG. 7C shows a streamline and flow arrow distribution map 700C of the conventional heat sink of FIG. 7A. The streamline and flow arrow distribution map 700C shows that there is extensive cross-flow under various sections of the impinging wall 702.

Figure 8A:
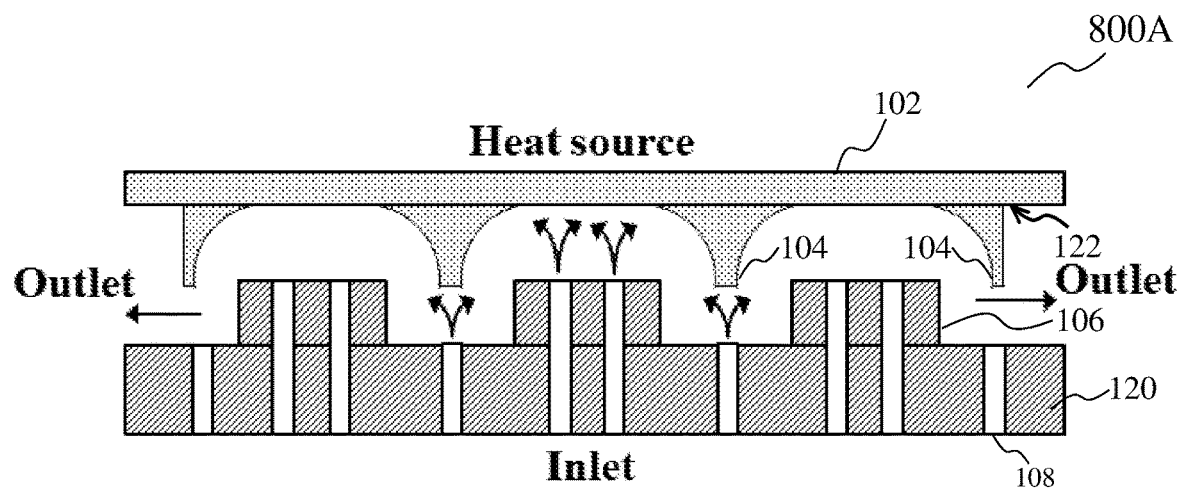
FIG. 8A shows a cross-sectional representative view of a heat sink according to various embodiments.

FIG. 8A shows a cross-sectional representative view 800A of the heat sink 100.

Figure 8B:
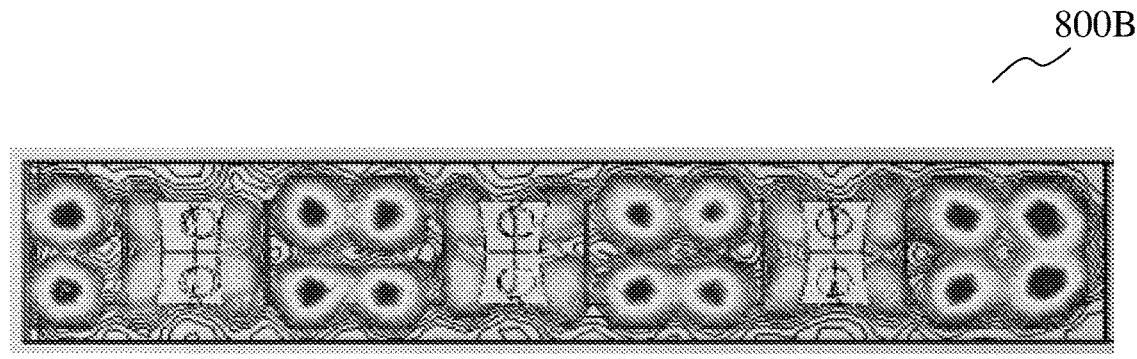
FIG. 8B shows a simulated heat map of the local heat transfer distribution of the heat sink of FIG. 8A.

FIG. 8B shows a simulated heat map 800B of the local heat transfer distribution of the heat sink 100. The heat map 800B shows that the local heat transfer coefficient is generally uniform across the heat sink 100.

Figure 8C:
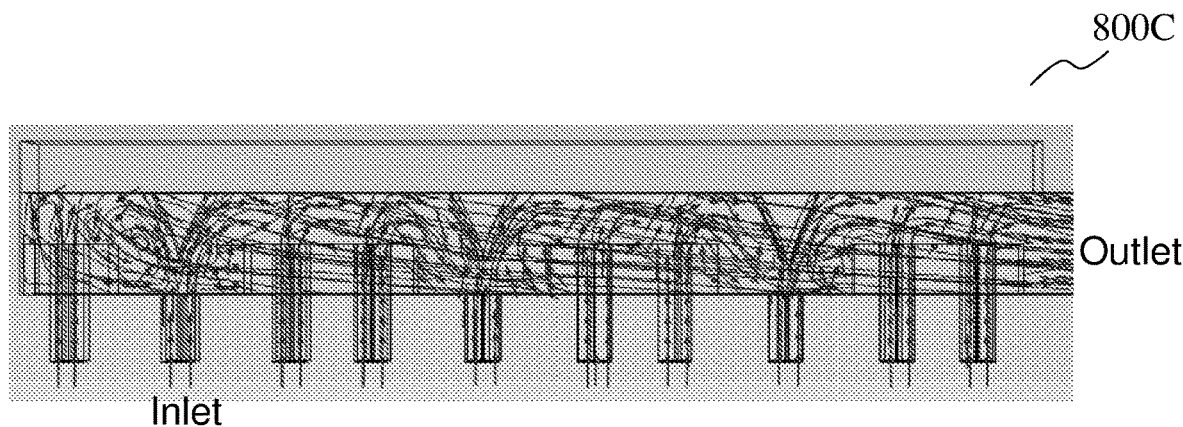
FIG. 8C shows a streamline and flow arrow distribution of the heat sink of FIG. 8A.

FIG. 8C shows a streamline and flow arrow distribution 800C of the heat sink 100. As compared to FIG. 7C, it may be seen that the effects of cross-flow is reduced.

The simulation results show that in comparison to the conventional heat sink, each nozzle in the heat sink 100 may achieve fully developed jet impingement. The heat sink 100 may achieve a substantially more aggressive cooling capability.

Further 3D simulation models were constructed to investigate the thermal performances of the heat sink 100. A quarter of the structure of the heat sink 100 was built with symmetry boundary conditions. The conventional heat sink is also simulated for comparison with the heat sink 100.

Figure 9A:
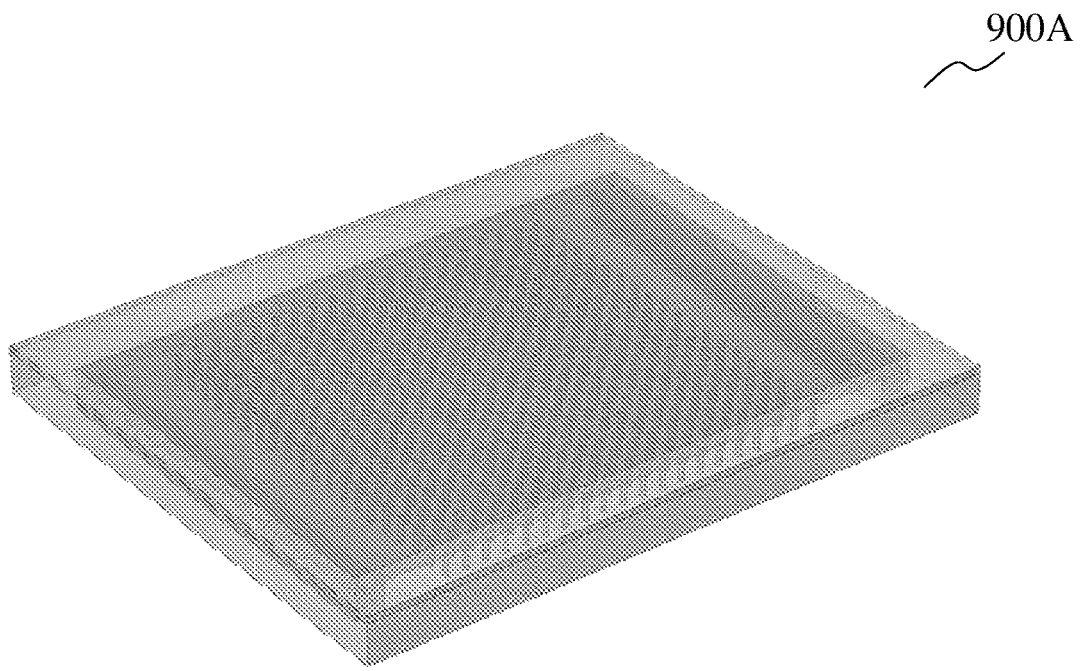
FIG. 9A shows a transparent view of a 3D simulation model of a heat sink according to various embodiments.

FIG. 9A shows the transparent view 900A of the 3D simulation model.

Figure 9B:
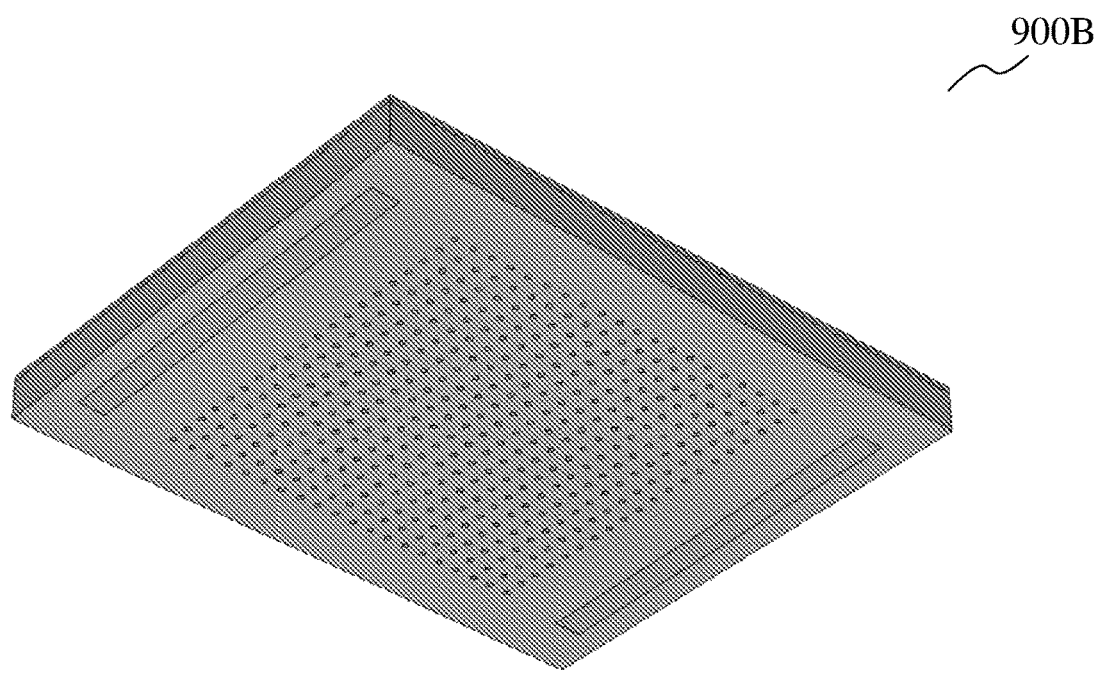
FIG. 9B shows a bottom view of the 3D simulation model of FIG. 9A.

FIG. 9B shows the bottom view 900B of the 3D simulation model.

Figure 10A:
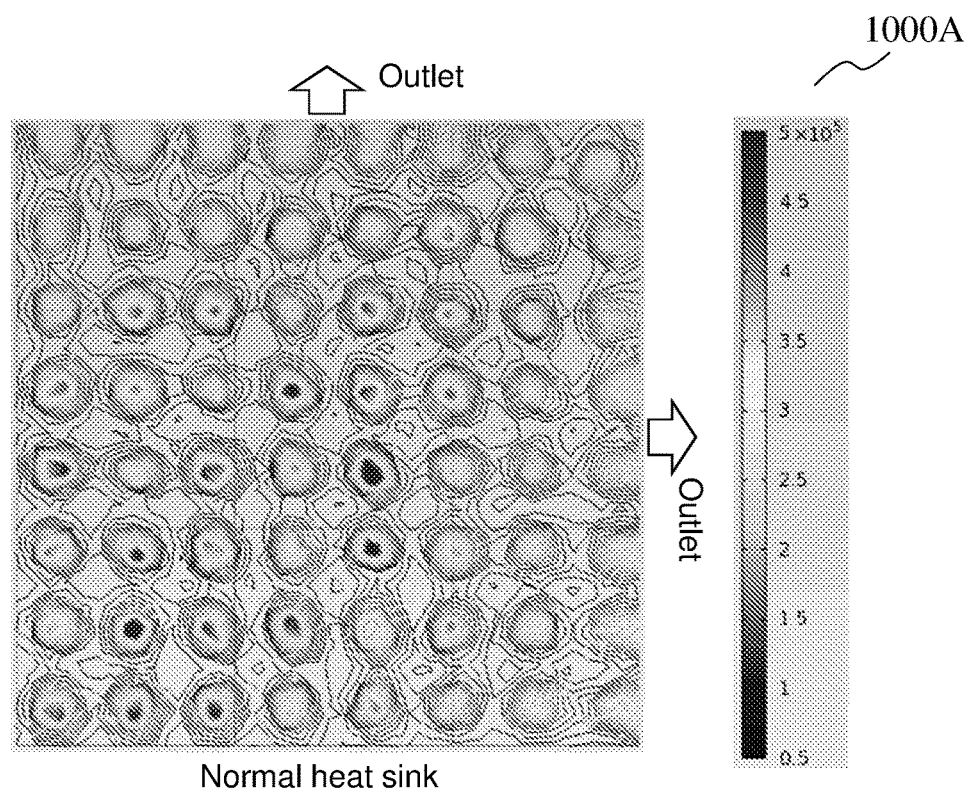
FIG. 10A shows a heat map of a conventional heat sink.

FIG. 10A shows a heat map 1000A of a conventional heat sink. The heat map 1000A shows the local heat transfer coefficient distribution of the conventional heat sink. In the conventional heat sink, the impinging coolant may flow out in four directions. The influences of the surrounding nozzles, including the cumulative accumulation of the cross-flows from the sequential rows of jets, may cause the effectiveness of each individual jet to diminish by increasing amounts with streamwise development. The accumulated cross-flow may cause each jet impingement concentration to deflect and bend in the downstream direction.

Figure 10B:
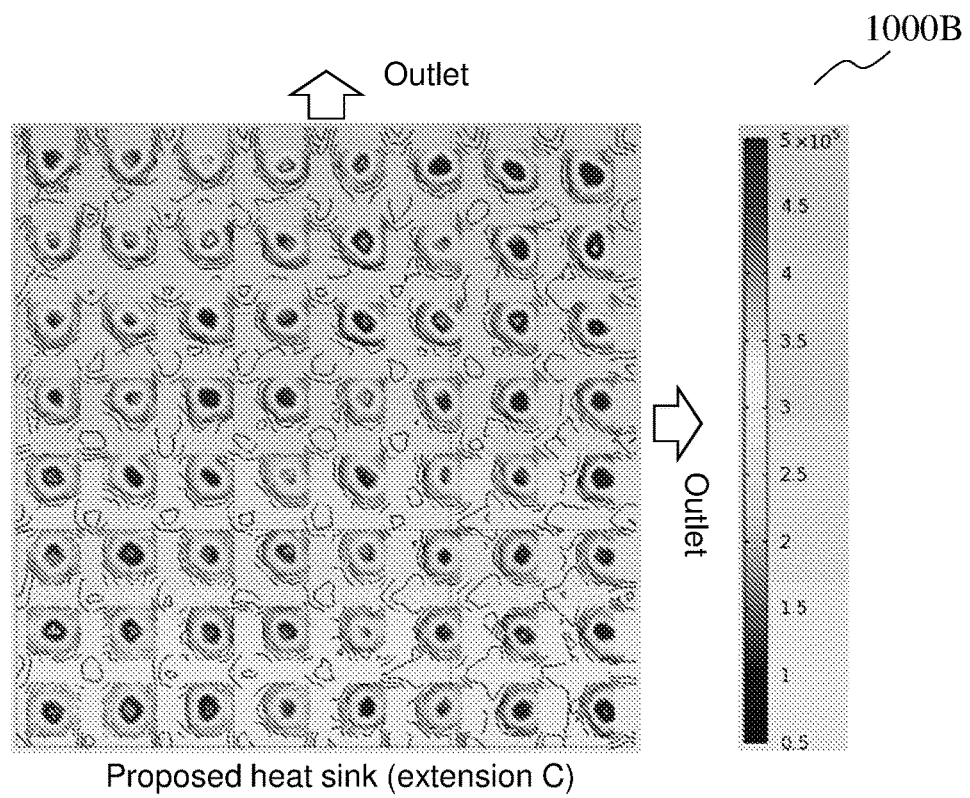
FIG. 10B shows a heat map of the simulated heat sink of FIG. 9A.

FIG. 10B shows a heat map 1000B of the simulated heat sink 100. The heat map 1000B shows the local heat transfer coefficient distribution of the heat sink 100. In the heat sink 100, the flow motion may be substantially different from in the conventional heat sink. The spent flows may be constrained, and jets of cooling fluid near the outlets may be highly enhanced. The change in the flow motion may also change the temperature distribution in the heat sink. The simulation results shown in the heat maps 1000A and 1000B show that much better cooling performance can be obtained in the heat sink 100. In the heat sink 100, each individual jet may be protected by both the raised nozzle array structure and the fins such that the accumulated flow may not directly affect the impinging flow. Without the cross-flow effect, the cooling capability of each impinging zone may be similar, such that the heat convection transfer may be improved. The spatially averaged heat transfer coefficient of the conventional heat sink and the heat sink 100 are about 10.9 W/cm²K and 16.7 W/cm²K, respectively. In other words, the heat sink 100 may achieve more than 53% improvement in heat transfer capability, over the conventional heat sink.

Figure 11:
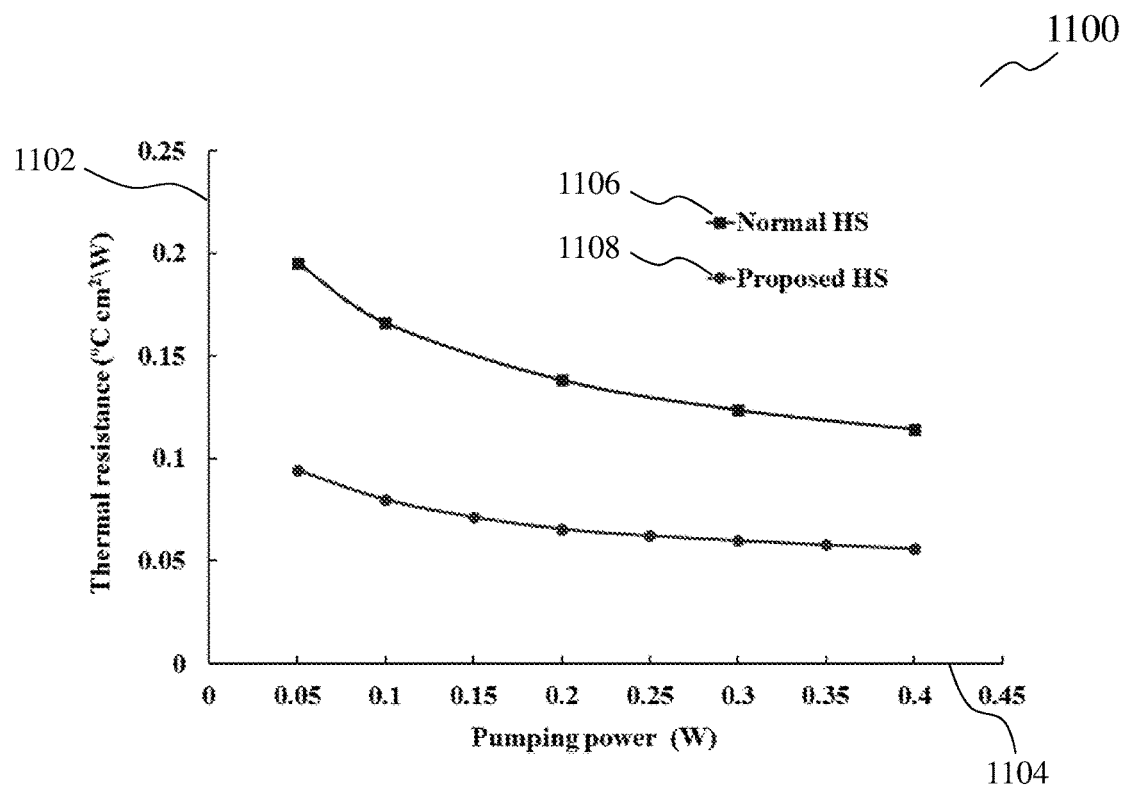
FIG. 11 shows a graph of the thermal resistance of the simulated heat sink of FIG. 9A as a function of pumping power.

FIG. 11 shows a graph 1100 of the thermal resistance of the heat sink as a function of pumping power. The graph 1100 has a vertical axis 1102 and a horizontal axis 1104. The vertical axis 1102 indicates thermal resistance in units of ° C. cm²\W. The horizontal axis 1104 indicates pumping power in units of Watts. The graph 1100 includes a first plot 1106 representing the thermal resistance of a conventional heat sink; and a second plot 1108 representing the thermal resistance of the heat sink 100. The thermal resistance of the conventional heat sink and the heat sink 100 are about 0.11 Kcm²/W and 0.06 Kcm²/W, respectively, suggesting more than 45% improvement in the thermal resistance performance of the heat sink 100.

Figure 12:
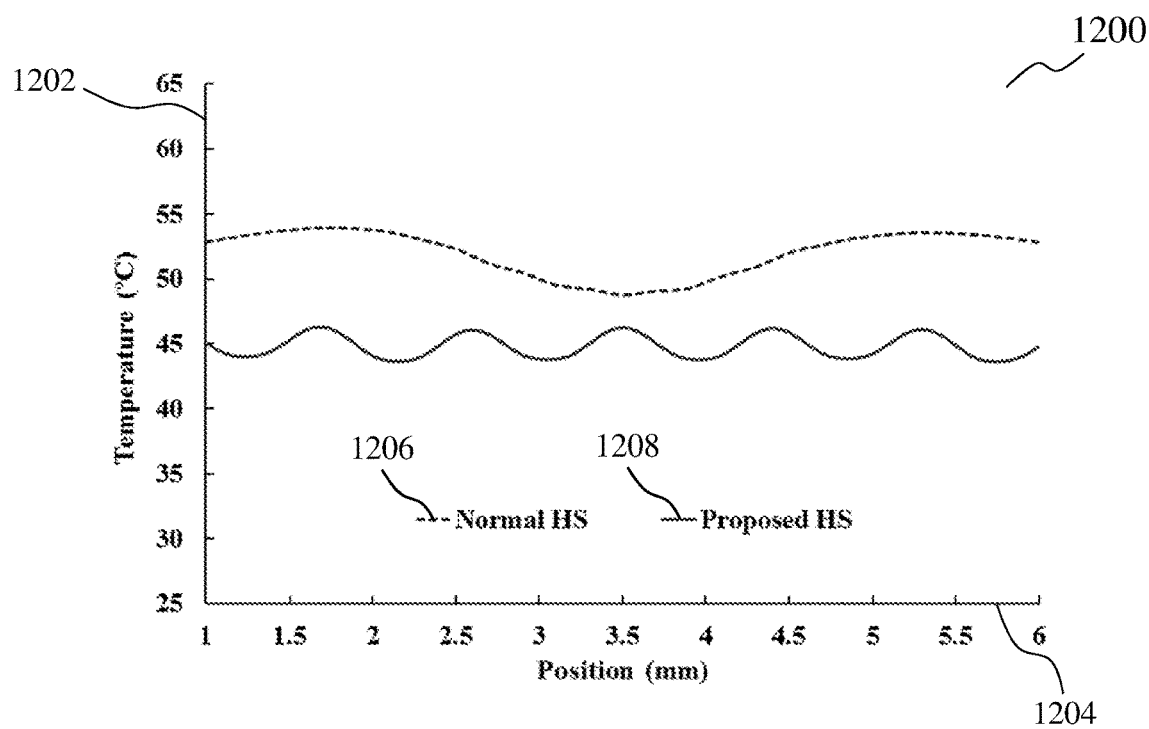
FIG. 12 shows a graph of the temperature profile comparison on the top surface of the conventional heat sink and the simulated heat sink of FIG. 9A.

FIG. 12 shows a graph 1200 of the temperature profile comparison on the top surface of the conventional heat sink and the heat sink 100. The graph 1200 has a vertical axis 1202 and a horizontal axis 1204. The vertical axis 1202 indicates temperature in ° C. The horizontal axis 1204 indicates position in units of millimeters. The graph 1200 includes a first plot 1206 representing the temperature of a conventional heat sink; and a second plot 1208 representing the temperature of the heat sink 100. The graph 1200 shows that the heat sink 100 may achieve a more uniform temperature distribution. The temperature variation rates of the conventional heat sink and the heat sink 100 are 11.7% and 4.5% respectively. In other words, the heat sink 100 achieves 61% enhanced cooling uniformity over the conventional heat sink.

Figure 13A:
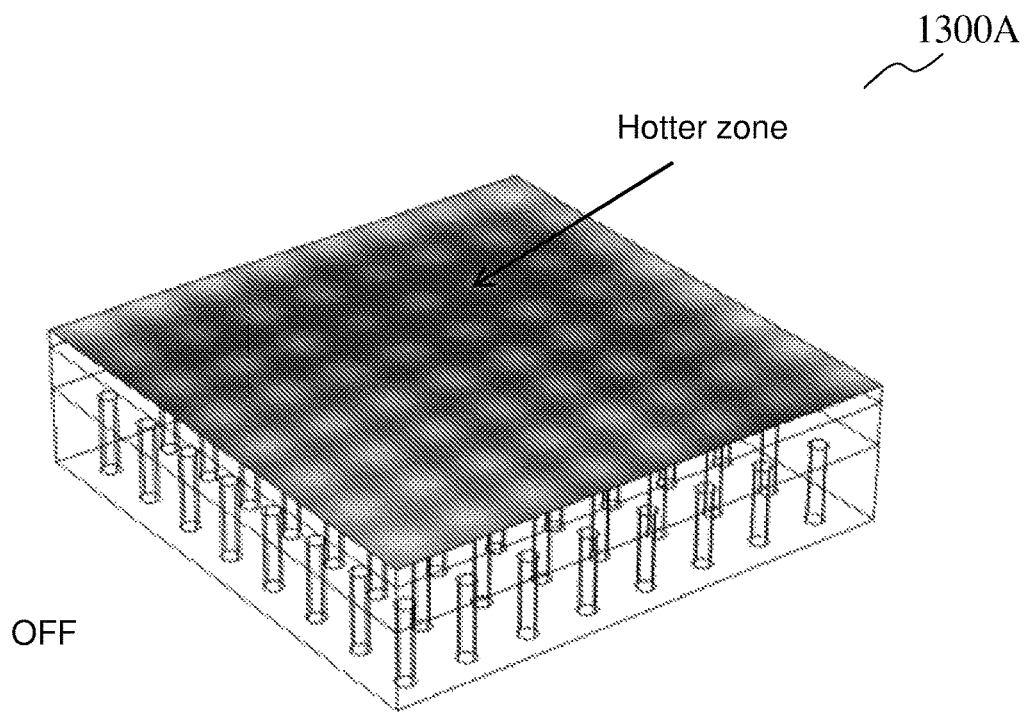
FIG. 13A shows the temperature distribution of the heat sink of FIG. 9A when the fins are inactivated.

FIG. 13A shows the temperature distribution 1300A of the heat sink 100 when the fins 104 are inactivated. There is a hot zone in the normal heat sink structure due to the weakened jets near the outlets.

Figure 13B:
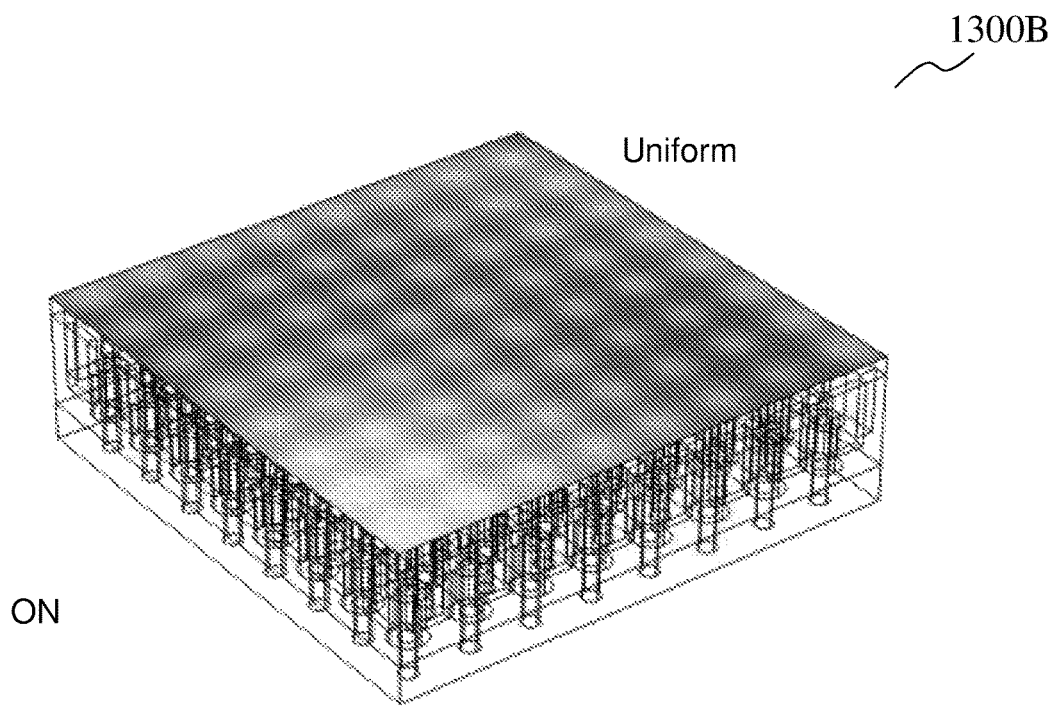
FIG. 13B shows the temperature distribution of the heat sink of FIG. 9A when the fins are activated.

FIG. 13B shows the temperature distribution 1300A of the heat sink 100 when the fins 104 are activated. With the fins activated, the average temperature of the heat sink 100 is much reduced, and the temperature of the heat sink is generally uniform across different parts of the heat sink 100.

According to various embodiments, the heat sink is capable of enhanced jet array impingement. The heat sink includes nozzle arrays of different lengths integrated in multiple raised structures. The heat sink also includes multiple cross-flow preventing fins surrounding the raised nozzle arrays. The stepped raised nozzle groups, raised nozzles of different layers or the nozzles at different layers may be integrated into a single heat sink. The fins may be thermally activated structures made of shape memory materials, to achieve passively adjustable flow distribution. By having the fins deactivated below the predetermined temperature, the heat sink may reduce flow resistance, thus decreasing the pumping energy required. When the electronic device to be cooled is at a low temperature, the deactivated fins may save pumping energy while maintain sufficient cooling capability.

Figure 14:
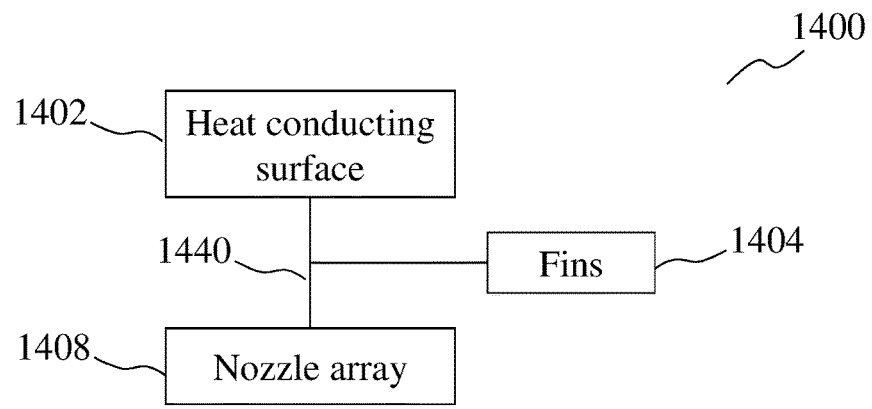
FIG. 14 shows a conceptual diagram of a heat sink according to various embodiments.

FIG. 14 shows a conceptual diagram of a heat sink 1400 according to various embodiments. The heat sink 1400 may include a heat conducting surface 1402, a plurality of nozzle arrays 1408 arranged under the heat conducting surface 1402, and a plurality of fins 1404 configured to at least partially surround a respective portion of the heat conducting surface facing a respective nozzle array 1408 of the plurality of nozzle arrays 1408. The plurality of nozzle arrays 1408 may be arranged such that output ends of nozzles of the plurality of nozzles arrays 1408 face the heat conducting surface 1402. The heat conducting surface 1402, the plurality of nozzle arrays 1408, and the plurality of fins 1404 may be coupled with each other, like indicated by lines 1440, for example thermally coupled, mechanically coupled, and/or electrically coupled.

In other words, according to various embodiments, the heat sink 1400 may include a heat conducting surface 1402, multiple nozzle arrays 1408 and multiple fins 1404. The heat sink 1400 may include, or may be part of, any one of the heat sinks 100, 300, 400, 500 or 600. The heat conducting surface 1402 may be at least substantially identical to, or similar to, the inner heat conducting surface 122. The nozzle array 1408 may be at least substantially identical to, or similar to, the nozzle array 230. Each nozzle array 1408 may include a plurality of nozzles, including at least a first nozzle and a second nozzle. The plurality of nozzles may be configured to impinge a fluid onto the heat conducting surface 1402. The distance between an output end of the first nozzle and the heat conducting surface 1402 may be shorter than the distance between an output end of the second nozzle and the heat conducting surface 1402. For example, the first nozzle may be the nozzle 108b and the second nozzle may be the nozzle 108a. The first nozzle may be longer than the second nozzle, or may be arranged to be closer to the heat conducting surface 1402. The fins 1404 may be at least substantially identical to, or similar to, the fins 104. The nozzle arrays 1408 may be arranged under the heat conducting surface 1402. The plurality of nozzle arrays 1408 may be arranged such that output ends of the plurality of nozzle arrays 1408 face the heat conducting surface. The plurality of fins 1404 may be arranged to at least partially enclose each portion of the heat conducting surface 1402 facing a respective nozzle array 1408 of the plurality of nozzle arrays 1408. The plurality of fins 1404 may include fins 1404 of different lengths. For example, the fins 1404 surrounding portions of the heat conducting surface 1402 that are further away from their directly facing nozzle arrays 1408 may be longer than the fins 1404 surrounding portions of the heat conducting surface 1402 that are near to their directly facing nozzle arrays 1408. The plurality of fins 1404 may extend from the heat conducting surface 1402 past an output end of nozzles of the plurality of nozzle arrays 1408, wherein the output end faces the heat conducting surface 1402. The plurality of nozzle arrays 1408 may protrude from a substrate. The substrate may be for example, the nozzle wall 120. The plurality of fins 1404 may be shorter than a distance between the heat conducting surface 1402 and the substrate. The fins 1404 may extend out of the heat conducting surface 1402, towards the substrate. In other words, the fins 1404 may not contact the substrate. The plurality of fins 1404 may include at fins of various shapes, for example, triangular fins, rectangular fins, or arcuate fins. The plurality of fins 1404 may also include thermally-activatable fins configured to at least partially surround the respective portion of the heat conducting surface 1402 when the respective portion of the heat conducting surface 1402 exceeds a predetermined temperature. The thermally-activatable fins may lie at least substantially parallel, or adjacent, to the heat conducting surface 1402 when the temperature of the heat conducting surface 1402 is below the predetermined temperature.

Figure 15:
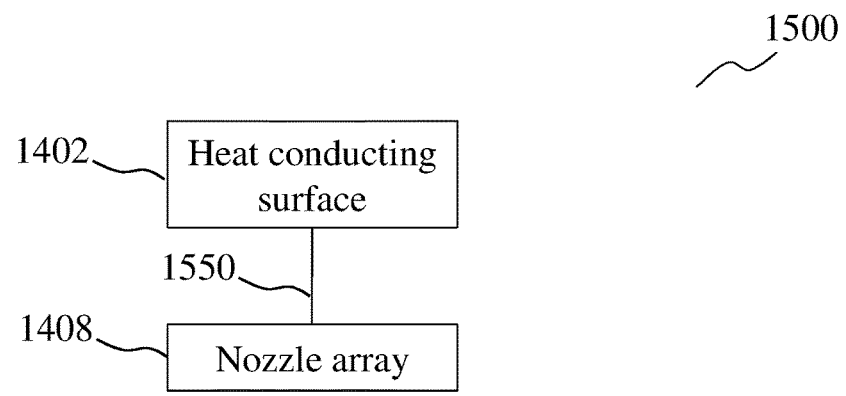
FIG. 15 shows a conceptual diagram of a heat sink according to various embodiments.

FIG. 15 shows a conceptual diagram of a heat sink 1500 according to various embodiments. The heat sink 1500 may include, or may be part of, any one of the heat sinks 100, 300, 400, 500, 600 or 1400. The heat sink 1500 may include a heat conducting surface 1402 and a nozzle array 1408. The nozzle array 1408 may be arranged under the heat conducting surface 1402. The nozzle array 1408 may be arranged such that output ends of at least one nozzle of the nozzle array face the heat conducting surface. The nozzle array 1408 may include a first nozzle and a second nozzle. The distance between an output end of the first nozzle and the heat conducting surface may be shorter than the distance between an output end of the second nozzle and the heat conducting surface. For example, the first nozzle may be the nozzle 108*b* and the second nozzle may be the nozzle 108*a*. The first nozzle may be longer than the second nozzle. Each of the output end of the first nozzle and the output end of the second nozzle may face the heat conducting surface 1402. The nozzle array 1408 may further include a third nozzle. The first nozzle may be arranged between the second nozzle and the third nozzle. The distance between the output end of the first nozzle and the heat conducting surface 1402 may be longer than a distance between an output end of the third nozzle and the heat conducting surface 1402. The nozzle array 1408 may be formed through a stepped substrate. A long nozzle of the nozzle array 1408 may be accommodated in a tall step of the stepped substrate while a short nozzle of the nozzle array 1408 may be accommodated in a short step of the stepped substrate.

Figure 16:
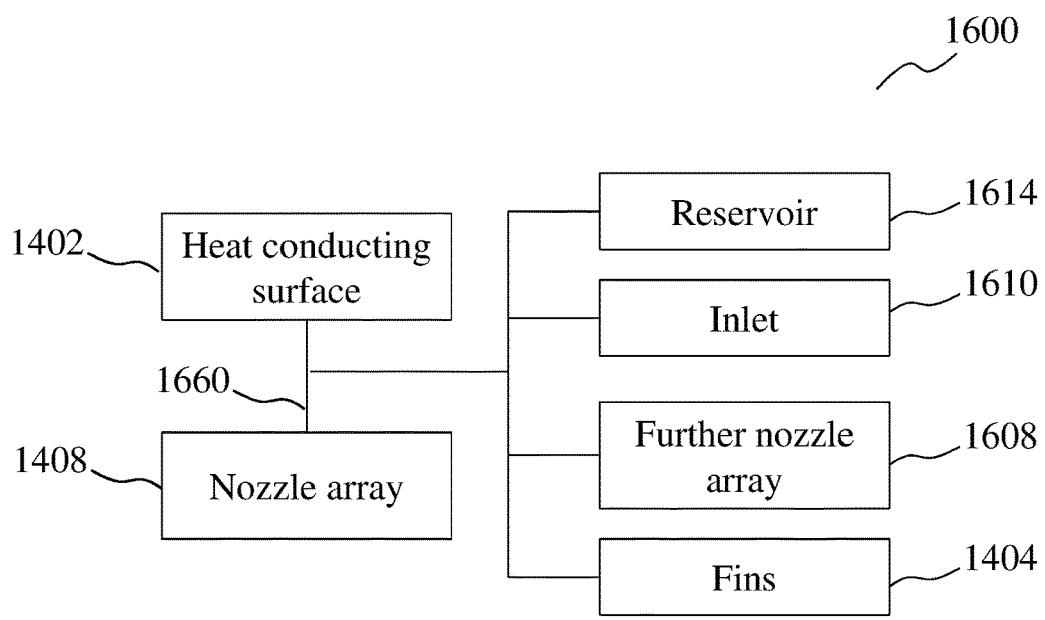
FIG. 16 shows a conceptual diagram of a heat sink according to various embodiments.

FIG. 16 shows a conceptual diagram of a heat sink 1600 according to various embodiments. The heat sink 1600 may include, or may be part of, any one of the heat sinks 100, 300, 400, 500, 600, 1400 or 1500. In addition to the components of the heat sink 1500, the heat sink 1600 may further include at least one of a reservoir 1614, an inlet 1610, a further nozzle array 1608 or a plurality of fins 1404. The reservoir 1614 may configured to hold a fluid. The inlet 1610 may be configured to receive the fluid and further configured to guide the fluid into the reservoir 1614. The reservoir 1614 may be at least substantially identical to, or similar to, the reservoir 114. The inlet 1610 may be at least substantially identical to, or similar to, the inlet 110. The further nozzle array 1608 may be controllable separately from the nozzle array 1408. For example, the nozzle array 1408 and the further nozzle array 1608 may be the nozzle arrays 230 and 230*a* respectively. The further nozzle array 1608 may be at least substantially identical, or similar, to the nozzle array 1408, except that it may be arranged in a different position within the heat sink 1600. The nozzle array 1408 may face a first portion of the heat conducting surface 1402. The nozzle array 1608 may face a second portion of the heat conducting surface 1402. The plurality of fins 1404 may at least partially surround each of the first portion and the second portion. The plurality of fins 1404 may separate the first portion from the second portion, to prevent cross-flow between the first portion and the second portion. The nozzle array 1408 may receive the fluid from a first reservoir 1614 via first inlet 1610 while the further nozzle array 1608 may receive the fluid from a second reservoir 1614 via a second inlet 1610. The plurality of fins 1404 may be configured to at least partially surround a portion of the heat conducting surface 1402 facing the nozzle array 1408. The plurality of fins 1404 may extend from the heat conducting surface 1402 to at least partially surround the first nozzle of the nozzle array 1408.

Figure 17:
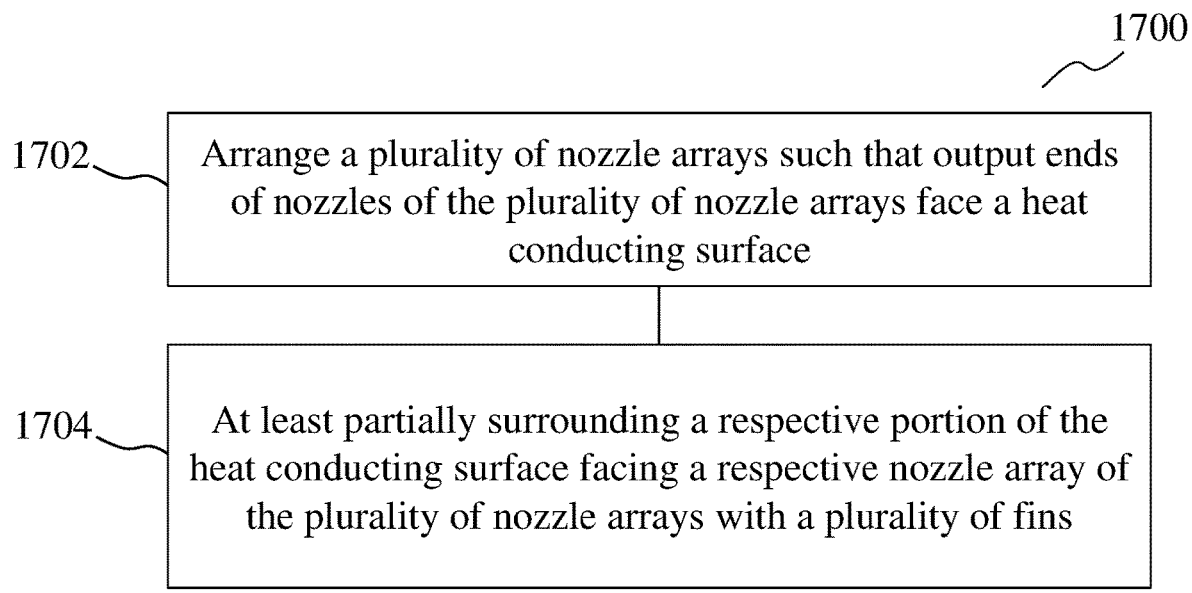
FIG. 17 shows a flow diagram of a method for fabricating a heat sink according to various embodiments.

FIG. 17 shows a flow diagram 1700 of a method for fabricating a heat sink according to various embodiments. The method may include processes 1702 and 1704. The process 1702 may include arranging a plurality of nozzle arrays such that output ends of nozzles of the plurality of nozzle arrays face a heat conducting surface. The plurality of nozzle arrays may be arranged under the heat conducting surface. The process 1704 may include at least partially surrounding a respective portion of the heat conducting surface facing a respective nozzle array of the plurality of nozzle arrays with a plurality of fins.

Figure 18:
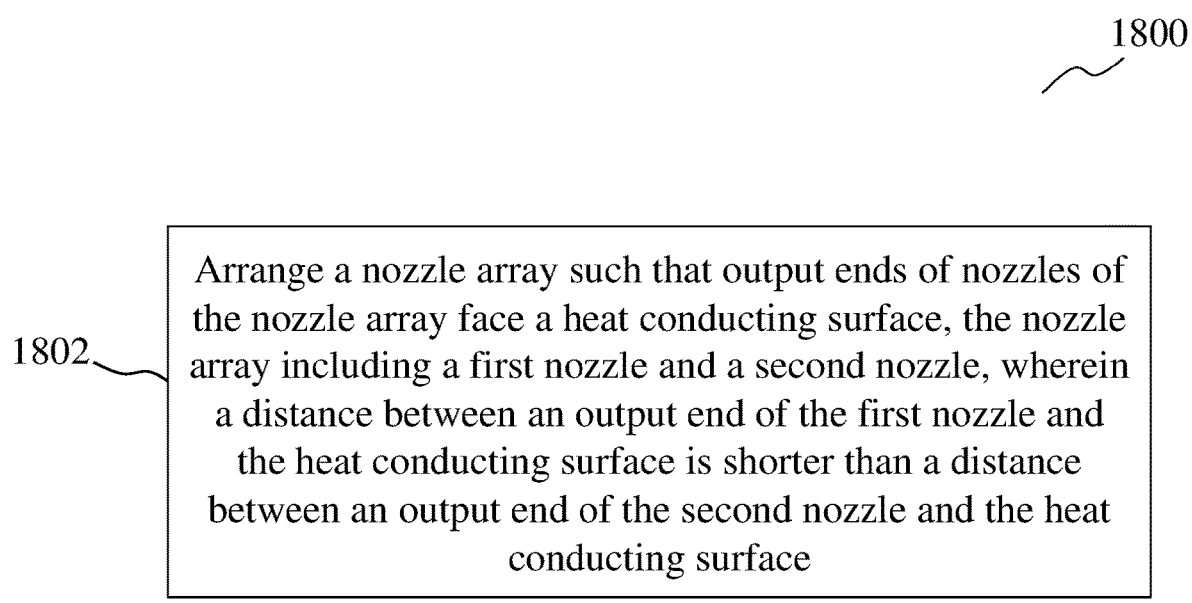
FIG. 18 shows a flow diagram of a method for fabricating a heat sink according to various embodiments.

FIG. 18 shows a flow diagram 1800 of a method for fabricating a heat sink according to various embodiments. The method may include process 1802. The process 1802 may include arranging a nozzle array such that output ends of nozzles of the nozzle array face a heat conducting surface. The nozzle array may be arranged under the heat conducting surface. The nozzle array may include a first nozzle and a second nozzle, wherein a distance between an output end of the first nozzle and the heat conducting surface is shorter than a distance between an output end of the second nozzle and the heat conducting surface The following examples pertain to further embodiments.

Example 1 is a heat sink including: a heat conducting surface; a plurality of nozzle arrays arranged such that output ends of nozzles of the plurality of nozzle arrays face the heat conducting surface; and a plurality of fins configured to at least partially surround a respective portion of the heat conducting surface facing a respective nozzle array of the plurality of nozzle arrays.

In example 2, the subject-matter of example 1 can optionally include that each nozzle array includes a first nozzle and a second nozzle, wherein a distance between the output end of the first nozzle and the heat conducting surface is shorter than a distance between the output end of the second nozzle and the heat conducting surface.

In example 3, the subject-matter of example 1 or example 2 can optionally include that each nozzle array of the plurality of nozzle arrays is configured to impinge a fluid onto the heat conducting surface.

In example 4, the subject-matter of any one of examples 1 to 3 can optionally include that the plurality of fins includes fins of different lengths.

In example 5, the subject-matter of any one of examples 1 to 4 can optionally include that the plurality of fins extend from the heat conducting surface past the output ends of nozzles of the plurality of nozzle arrays.

In example 6, the subject-matter of any one of examples 1 to 5 can optionally include that the plurality of nozzle arrays protrude from a substrate.

In example 7, the subject-matter of example 6 can optionally include that the plurality of fins are shorter than a distance between the heat conducting surface and the substrate.

In example 8, the subject-matter of any one of examples 1 to 7 can optionally include that the plurality of fins includes at least one of triangular fins, rectangular fins or arcuate fins.

In example 9, the subject-matter of any one of examples 1 to 8 can optionally include that the plurality of fins includes thermally-activatable fins configured to at least partially surround the respective portion of the heat conducting surface when the respective portion of the heat conducting surface exceeds a predetermined temperature.

In example 10, the subject-matter of example 9 can optionally include that the thermally-activatable fins are at least substantially parallel to the heat conducting surface when the heat conducting surface is below the predetermined temperature.

Example 11 is a heat sink including: a heat conducting surface; and a nozzle array arranged such that output ends of nozzles of the nozzle array face the heat conducting surface, the nozzle array including a first nozzle and a second nozzle; wherein a distance between the output end of the first nozzle and the heat conducting surface is shorter than a distance between the output end of the second nozzle and the heat conducting surface.

In example 12, the subject-matter of example 11 can optionally include that each of the output end of the first nozzle and the output end of the second nozzle face the heat conducting surface.

In example 13, the subject-matter of example 11 or example 12 can optionally include that the first nozzle is longer than the second nozzle.

In example 14, the subject-matter of example 11 can optionally include: a reservoir configured to hold a fluid; and an inlet configured to receive the fluid and further configured to guide the fluid into the reservoir.

In example 15, the subject-matter of any one of examples 11 to 14 can optionally include: a further nozzle array, the further nozzle array being controllable separately from the nozzle array.

In example 16, the subject-matter of example 15 can optionally include that the nozzle array faces a first portion of the heat conducting surface and the further nozzle array faces a second portion of the heat conducting surface, wherein a plurality of fins at least partially surround each of the first portion and the second portion.

In example 17, the subject-matter of example 15 or example 16 can optionally include that the nozzle array receives a fluid from a first reservoir via a first inlet, and wherein the further nozzle array receives a further fluid from a second reservoir via a second inlet.

In example 18, the subject-matter of any one of examples 11 to 17 can optionally include that the first nozzle is arranged between the second nozzle and a third nozzle, wherein the distance between the output end of the first nozzle and the heat conducting surface is longer than a distance between the output end of the third nozzle and the heat conducting surface.

In example 19, the subject-matter of any one of examples 11 to 18 can optionally include that the nozzle array is formed through a stepped substrate, wherein a long nozzle of the nozzle array is accommodated in a tall step of the stepped substrate and wherein a short nozzle of the nozzle array is accommodated in a short step of the stepped substrate.

In example 20, the subject-matter of any one of examples 11 to 19 can optionally include: a plurality of fins configured to at least partially surround a portion of the heat conducting surface facing the nozzle array.

In example 21, the subject-matter of example 20 can optionally include that the plurality of fins extend from the heat conducting surface to at least partially surround the first nozzle.

Example 22 is a method for fabricating a heat sink, the method including: arranging a plurality of nozzle arrays such that output ends of nozzles of the plurality of nozzle arrays face a heat conducting surface; and at least partially surrounding a respective portion of the heat conducting surface facing a respective nozzle array of the plurality of nozzle arrays with a plurality of fins.

Example 23 is a method for fabricating a heat sink, the method including: arranging a nozzle array such that output ends of nozzles of the nozzle array face a heat conducting surface, the nozzle array including a first nozzle and a second nozzle, wherein a distance between the output end of the first nozzle and the heat conducting surface is shorter than a distance between the output end of the second nozzle and the heat conducting surface.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

It will be appreciated to a person skilled in the art that the terminology used herein is for the purpose of describing various embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The invention claimed is:

1. A heat sink comprising:
a heat conducting surface;
a plurality of nozzle arrays arranged such that output ends of nozzles of the plurality of nozzle arrays face the heat conducting surface; and
a plurality of fins configured to at least partially surround each portion of the heat conducting surface facing a respective nozzle array of the plurality of nozzle arrays such that when a nozzle array of the plurality of nozzle arrays ejects a fluid, the plurality of fins direct the fluid ejected by the nozzle array to impinge on a respective portion of the heat conducting surface;
wherein the plurality of fins comprises thermally-activatable fins configured to at least partially surround the respective portion of the heat conducting surface when the respective portion of the heat conducting surface exceeds a predetermined temperature.

2. The heat sink of claim 1, wherein each nozzle array comprises a first nozzle and a second nozzle, wherein a distance between the output end of the first nozzle and the heat conducting surface is shorter than a distance between the output end of the second nozzle and the heat conducting surface.

3. The heat sink of claim 1, wherein the plurality of fins comprises fins of different lengths.

4. The heat sink of claim 1, wherein the plurality of fins extend from the heat conducting surface past an output end of nozzles of the plurality of nozzle arrays.

5. The heat sink of claim 1, wherein the plurality of nozzle arrays protrude from a substrate.

6. The heat sink of claim 1, wherein the plurality of fins comprises rectangular fins or arcuate fins.

7. The heat sink of claim 1, wherein the thermally-activatable fins are at least substantially parallel to the heat conducting surface when the heat conducting surface is below the predetermined temperature.

8. A heat sink comprising:
a heat conducting surface;
a nozzle array arranged such that output ends of nozzles of the nozzle array face the heat conducting surface, the nozzle array comprising a first nozzle and a second nozzle;
a further nozzle array, the further nozzle array being controllable separately from the nozzle array; and
a plurality of fins;
wherein a distance between the output end of the first nozzle and the heat conducting surface is shorter than a distance between the output end of the second nozzle and the heat conducting surface;
wherein the first nozzle is longer than the second nozzle;
wherein each of the first nozzle and the second nozzle is configured to impinge a fluid onto the heat conducting surface; and
wherein the nozzle array faces a first portion of the heat conducting surface and the further nozzle array faces a second portion of the heat conducting surface, wherein the plurality of fins at least partially surround each of the first portion of the heat conducting surface and the second portion of the heat conducting surface; and
wherein the plurality of fins comprises thermally-activatable fins configured to at least partially surround the first portion of the heat conducting surface when the first portion of the heat conducting surface exceeds a predetermined temperature, and configured to at least partially surround the second portion of the heat conducting surface when the second portion of the heat conducting surface exceeds the predetermined temperature.

9. The heat sink of claim 8, wherein each of the output end of the first nozzle and the output end of the second nozzle face the heat conducting surface.

10. The heat sink of claim 8, further comprising:
a reservoir configured to hold the fluid; and
an inlet configured to receive the fluid and further configured to guide the fluid into the reservoir.

11. The heat sink of claim 8, wherein the nozzle array receives a fluid from a first reservoir via a first inlet, and wherein the further nozzle array receives a further fluid from a second reservoir via a second inlet.

12. The heat sink of claim 8, wherein the first nozzle is arranged between the second nozzle and a third nozzle, wherein the distance between the output end of the first nozzle and the heat conducting surface is longer than a distance between the output end of the third nozzle and the heat conducting surface.

13. The heat sink of claim 8, wherein the nozzle array is formed through a stepped substrate, wherein a long nozzle of the nozzle array is accommodated in a tall step of the stepped substrate and wherein a short nozzle of the nozzle array is accommodated in a short step of the stepped substrate.

14. A method for fabricating a heat sink, the method comprising:
arranging a plurality of nozzle arrays such that output ends of nozzles of the plurality of nozzle arrays face a heat conducting surface; and
at least partially surrounding each portion of the heat conducting surface facing a respective nozzle array of the plurality of nozzle arrays with a plurality of fins, such that when a nozzle array of the plurality of nozzle arrays ejects a fluid, the plurality of fins direct the fluid ejected by the nozzle array to impinge on a respective portion of the heat conducting surface;
wherein the plurality of fins comprises thermally-activatable fins configured to at least partially surround the respective portion of the heat conducting surface when the respective portion of the heat conducting surface exceeds a predetermined temperature.

* * * * *